United States Patent

Yasuda et al.

Patent Number: 5,223,304
Date of Patent: Jun. 29, 1993

[54] PROCESS FOR FABRICATING MAGNETIC DISKS

[75] Inventors: Shinichi Yasuda; Atsushi Tamura; Tadahito Kanaizuka, all of Nagoya, Japan

[73] Assignee: Sumitomo Metal Mining Company, Limited, Tokyo, Japan

[21] Appl. No.: 987,817

[22] Filed: Dec. 9, 1992

[30] Foreign Application Priority Data

Dec. 12, 1991 [JP] Japan .................. 3-351463

[51] Int. Cl.⁵ .................. B05D 5/12; C23C 14/00; B32B 3/02
[52] U.S. Cl. .................. 427/129; 204/192.1; 427/128; 427/131; 427/132; 427/250; 427/255.3; 428/64; 428/900; 428/928
[58] Field of Search .................. 427/129, 128, 131, 132, 427/250, 255.3; 428/64, 694, 900, 928; 204/192.1

Primary Examiner—Bernard Pianalto
Attorney, Agent, or Firm—Watson, Cole, Grindle & Watson

[57] ABSTRACT

A process for fabricating a magnetic disk which comprises texturing a magnetic disk substrate made of a non-magnetic material having provided on the surface thereof a hard layer of a metal or an oxide to thereby provide fine irregularities on the surface of said substrate, followed by establishing thereon a magnetic recording layer comprising a film of a ferromagnetic metal, wherein said texturing is carried out using a processing solution comprising an aqueous solution of a surface active agent having dispersed therein diamond abrasive grains substantially only not larger than 4 μm in grain diameter.

8 Claims, 3 Drawing Sheets ent invention provides a process for advantageously
PROCESS FOR FABRICATING MAGNETIC DISKS

BACKGROUND OF THE INVENTION

1. Field of the Invention

The present invention relates to a process for fabricating a magnetic disk using a thin film of a ferromagnetic metal suited for high density magnetic recording as the magnetic recording medium.

2. Prior Art

In the magnetic disks using rigid substrates, as compared with the conventional coated type magnetic disks, the surface smoothness of a disk has been more severely pursued to realize high-density recording. This applies, more particularly, to the so-called thin-film magnetic disks such as sputtered disks and plated disks. However, as the surface of the disk achieves a further smoother surface, there arises a problem of unfavorable contact between the magnetic head and the magnetic disk. That is, the magnetic head sticks, or in other words, is adsorbed to the magnetic disk upon resting it on a magnetic disk. This phenomenon occurs due to the presence of moisture or lubricants which are adsorbed to the surface of disk. To overcome this problem, it has been proposed to provide, on the surface of the magnetic disk substrate, a fine pattern of concentrical circles along the periphery of the substrate. Accordingly, a so-called texturing has been applied to magnetic disk substrates to develop fine irregularities in such a manner to reduce surface adsorption and to impart magnetic anisotropy to the magnetic film along the peripheral direction of the disk. In the proposed processes, texturing has been carried out by using a polishing tape comprising a polyester base tape having bonded and fixed thereto abrasive grains of alumina, or a polishing solution comprising abrasive grains of alumina, silicon carbide, etc., being dispersed in a solution.

With increasing magnetic recording density, on the other hand, it is desired to lower the flying height of the non-contact type magnetic head, i.e., to bring the magnetic head closer to the magnetic disk and to thereby achieve a higher signal sensitivity when making a record reproduction, This inevitably requires that the surface roughness of the disk substrate is minimized.

However, this requirement could not be fulfilled by polishing a magnetic disk substrate with a polishing tape having fixed thereon alumina abrasive grains. When a magnetic disk substrate was textured with such a polishing tape, minute protrusions in addition to the concentrical grooves were found irregularly on the surface. Accordingly, the magnetic head frequently collided against the protrusions upon shortening the flying height of the magnetic head, leading to a frequent occurrence of a so-called "head-hit". Thus, it was not possible to lower the magnetic head over the disk to too large an extent. On the other hand, however, too slight a texturing as to cause no head-hit results in too smooth a surface as to being about serious problem of head sticking.

In polishing the substrate using a polishing solution having dispersed therein alumina abrasive grains, there also occurred problems such as the formation of protrusions as mentioned above and the anchoring of alumina grains into the surface of the substrates, which gave protrusion-like effects. In this case again, it was not feasible to lower the magnetic head over the substrate to achieve a shorter flying height. It was possible, though, to suppress the formation of the protrusions on the surface of the substrate by shortening the processing duration or by lowering the pressure during the texturing, but this time, there inevitably occurred the problem of sticking of the magnetic head.

SUMMARY OF THE INVENTION

The present invention has been achieved in the light of the circumstances described hereinbefore. The present invention provides a process for advantageously fabricating a magnetic disk which achieves a lower flying height of a magnetic head without calling forth the problems of sticking of magnetic head and head-hit.

The present invention provides a process for fabricating a magnetic disk which comprises texturing a magnetic disk substrate made of a non-magnetic material having provided on the surface thereof a hard layer made of a metal or an oxide to give fine irregularities on the surface thereof, and then depositing a magnetic recording layer made of a ferromagnetic metal on the finely textured surface of the magnetic disk substrate, wherein, said texturing is carried out using a processing solution comprising an aqueous solution of a surface active agent having dispersed therein diamond abrasives which are substantially only 4 μm or less in grain diameter.

DETAILED DESCRIPTION OF THE INVENTION

Figure 1:
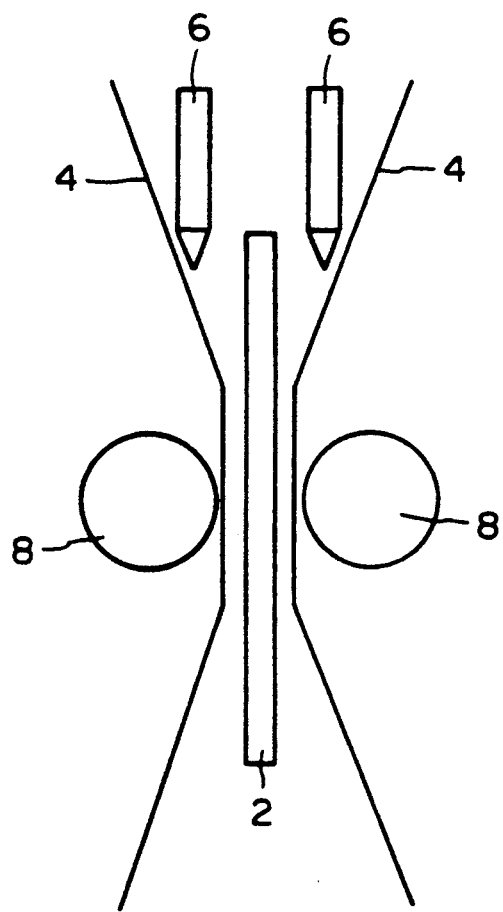
FIG. 1 is an explanatory figure which shows schematically an example of conducting texturing on a disk substrate.

The Process for fabricating a magnetic disk according to the present invention provides a magnetic disk which enable operating a magnetic head at a lower flying height without suffering problems of magnetic head sticking and head hit. This magnetic disk has been accomplished by taking notice of the protrusions which develop on the surface of the magnetic disk.

The flatness of a substrate is of particular importance in fabricating magnetic disks, because a reduction of distance between a flying magnetic head and a magnetic disk is desired for achieving recording at a higher recording density. Accordingly, a process for fabricating a magnetic disk in general comprises coating disk substrate with a non-magnetic metal and polishing the surface of the resulting coated substrate to improve the flatness. Furthermore, a disk substrate may be coated with a hard material having favorable cuttability such as Ni-P by plating, to thereby improve processability of the substrate on texturing. On subjecting those substrates to texturing using a polishing tape having bonded thereon alumina abrasive grains, however, the substrates often suffered formation of deep flaws due to the anchoring of the abrasive grains or formation of minute protrusions. On using a processing solution having dispersed therein alumina abrasive grains, similarly, the substrates were susceptible to causing head-hit due to the sharp abrasive alumina grains having anchored on the surface of the substrate. Moreover, substrates having processed with an alumina processing solution failed to achieve sufficient magnetic properties.

Accordingly, the present inventors have conducted extensive studies on texturing conditions in view to overcome the foregoing problems. As a result, it has been found that the use of diamond, a hardest material having favorable cuttability, as the material for the abrasive grains gives the most desirable surface shape to the substrate. The present invention has been accomplished based on these findings. More specifically, the process according to the present invention provides disk substrates effectively improved in surface properties, and it comprises conducting texturing of a disk substrate using a processing solution comprising an aqueous solution of surface active agent having dispersed therein diamond grains substantially only not larger than 4 $\mu$m in grain diameter. Since diamond grains as abrasive grains have regular forms and give sharp edges with their crystal planes, it is believed that a relatively uniform and fine irregularities are thereby produced on the surface of the substrates if the texturing according to the present invention is conducted by using the abrasive. grains including large diamond grains as to exceed 4 $\mu$m in grain diameter, protrusions which may cause head-hit tend to form on the substrate. Accordingly, the diamond grains for use as the abrasive grains in the process according to the present invention must be confined to those having a granularity of 4 $\mu$m or less. More preferably, the diamond grains for use in the present invention have a narrow particle size distribution as such that 90% by volume average or more of the grains fall in the size range of from 1 to 3 $\mu$m in diameter. By thus controlling the size of the diamond grains, a further favorable substrate having irregularities with more uniform pitch and height can be obtained.

In the process according to the present invention, the processing solution comprises a surface active agent. The surface active agent in the solution functions effectively to prevent the diamond grains from being sedimented and to thereby have the diamond grains uniformly dispersed in the solution. Any known surface active agents may be used in the present invention without any limitation, and are generally incorporated into the solution at an amount of 5% by weight or less. The diamond grains are added and dispersed in the aqueous solution of the surface active agent, in general, at an amount of 5% by weight or less.

The processing solution for use in the texturing according to the present invention is provided as an aqueous solution. This is advantageous in cleaning the substrate after the texturing step. The polished wastes of Ni-P and the like or diamond abrasive grains having adhered to the substrate during texturing can be readily washed off using water and a blush. Hence, a substrate is completely free from head-hit problems ascribed to the abrasive grains having anchored on the surface of the substrate.

The magnetic disk substrate for use in the process according to the present invention is made from a non-magnetic metal such as aluminum, glass, resin, and other non-magnetic rigid materials. Those materials are preferred in view of the fact that a flatness is required to the substrate, which is requisite for achieving a shorter distance between the disk and the flying magnetic head to cope with a higher recording density. Accordingly, a hard layer made from a hard and free cutting metal (inclusive of alloy) is provided on the whole surface of a substrate, i.e., a metal, a glass, or a resin, to reinforce the substrate base and to improve the cuttability thereof. The use of an aluminum or its alloy for the substrate base is advantageous in that the surface thereof can be oxidized, i.e., subjected to a so called alumite treatment, to give a hard layer of an oxide.

The disk substrate thus obtained through the process above is then subjected to texturing according to the present invention to provide minute irregularities on the surface thereof. This step is followed by establishing a magnetic recording layer using a predetermined thin film of a ferromagnetic metal on the surface of roughened substrate. Any type of known thin films of ferromagnetic metal may be used for the magnetic recording layer, and examples include a $\gamma$-$Fe_2O_3$ film having deposited by sputtering, as well as a sputter- or vapor-deposited film or plated film based on Co, a Co-Ni system alloy, a Co-Pt system alloy, a Co-Cr-Ta system alloy, and an Fe-based alloy. Optionally, a Cr layer or a layer of an Cr alloy may be incorporated as an under layer for the magnetic recording layer to control the magnetic properties of the magnetic recording layer.

Furthermore, similarly to the case of conventional magnetic substrates, the magnetic recording layer may be coated with a protective layer such as a carbon film. The protective layer may be further covered with a lubricating layer by coating the protective layer with a fluorocarbon lubricant and the like. In this manner, a desired magnetic disk can be obtained.

The present invention is described in further detail by referring to non-limiting examples. It should be understood, however, that the present invention is not construed as being limited thereto.

EXAMPLES

An aluminum alloy disk substrate of 95 mm in outer diameter, 25 mm in inner diameter, and 1.27 mm in thickness was wholly covered with a 15 $\mu$m thick Ni-P alloy layer using a known electroless plating process. The resulting Ni-P alloy-coated disk substrate was lapped and polished to give a mirror-finished surface having a surface roughness Ra of 5 nm.

Referring to FIG. 1, the texturing step according to the present invention is described. The polished substrate 2 was rotated at a rate of from 100 to 500 rpm, and a polishing cloth 4 was pressed against the rotating substrate 2 by applying a force of from 0.5 to 3 kgf, while supplying a processing solution dropwise through a nozzle 6. The processing solution was an aqueous solution containing a surfactant (sodium alkyl ether sulfonate) at a concentration of 3% by weight, having dispersed therein diamond abrasive grains of 3 $\mu$m or less in diameter at concentration of 3% by weight. The texturing was conducted for a duration of 30 seconds. The disk substrates of Examples 1 to 5 were obtained essentially in this manner, while varying the rotating speed of the substrate 2 and the pressing force applied to the polishing cloth.

Separately, a disk substrate according to Comparative Example 1 was obtained by texturing a substrate using a processing solution similar to the one above, except for using diamond abrasive grains containing 10% by weight of larger grains from 4 to 5 μm in diameter. A disk substrate according to Comparative Example 2 was obtained by texturing a substrate using a processing solution similar to the one used in Examples 1 to 5 above, except for using alumina grains in the place of diamond abrasive grains, said alumina grains having a similar granularity to that of the diamond abrasive grains. Furthermore, a disk substrate according to Comparative Example 3 was obtained by texturing similarly a substrate, except for using a polishing tape prepared by fixing and bonding alumina abrasive grains of 3 μm in average diameter on a polyester film.

The surface roughness (Ra) of each of the disk substrates thus obtained was measured, and the results are given in Table 1 below. It can be seen therefrom that the substrates obtained by texturing according to the present invention using a grain-dispersed processing solution containing diamond abrasive grains all yield a roughness average Ra of about 8 nm, a value well comparable to those obtained on other substrates of Comparative Examples.

The surface roughness (Ra) of the textured disk substrates given in Table 1 was measured using a stylus-type roughness meter equipped with a diamond stylus with an edge having a radius of curvature of 2.5 μm. The measurement was conducted by applying a load of 2 mg to the stylus and moving the stylus at a spacing of 0.5 μm. The surface roughness of the substrate was calculated from signals having loaded on a computer at a rate of 2,000 points per 1 mm.

TABLE 1

| Ex. Nos. | Rotation Speed (rpm) | Load (kgf) | Surface Roughness (Ra: nm) | Abrasive Grains | Processing Method |
|---|---|---|---|---|---|
| Ex. 1 | 100 | 2 | 7.5 | diamond | processing solution |
| Ex. 2 | 300 | 2 | 8 | diamond | processing solution |
| Ex. 3 | 500 | 2 | 9.1 | diamond | processing solution |
| Ex. 4 | 300 | 0.5 | 7.8 | diamond | processing solution |
| Ex. 5 | 300 | 3 | 8.5 | diamond | processing solution |
| Comp. Ex. 1 | 300 | 2 | 8.5 | diamond | processing solution |
| Comp. Ex. 2 | 300 | 2 | 8.2 | alumina | processing solution |
| Comp. Ex. 3 | 300 | 2 | 8.5 | alumina | polishing tape |

Furthermore, a disk substrate according to Comparative Example 4 was obtained in the same manner as in the process for texturing the substrate of Comparative Example 2 using a processing solution containing alumina abrasive grains and by applying a similar load to the polishing cloth, except for carrying out the texturing for a shorter duration of 18 seconds. A disk substrate according to Comparative Example 5 was obtained in the same manner as in the process of Comparative Example 3, except for changing the processing duration to a shorter 18 seconds. The surface roughness for the substrates of the Comparative Examples 4 and 5 was measured in the same manner as in the foregoing Examples, and the results are given in Table 2.

TABLE 2

| Ex. Nos. | Load (kgf) | Processing Duration (sec) | Surface Roughness (Ra: nm) | Abrasive Grains | Processing Method |
|---|---|---|---|---|---|
| Comp. Ex. 4 | 2 | 18 | 6.5 | alumina | processing solution |
| Comp. Ex. 5 | 2 | 18 | 6.7 | alumina | polishing tape |

On each of the substrates thus obtained was deposited Cr film as an under layer to a thickness of 500 Å by DC magnetron sputtering at a substrate temperature of 300° C., an Ar gas pressure of 10 mTorr, and a DC input power of 5 W/cm$^2$. Subsequently, a Co-Cr-Ta based magnetic recording medium was deposited thereon to a thickness of 300 Å by applying a negative bias voltage of 150 V between the substrate and the sputter target. A carbon protective film was provided thereon under film deposition conditions similar to those employed in deposition of the Cr under layer. The lubricant film was coated with a 20 Å thick layer by applying a lubricant on the carbon protective film by spin coating. In this manner, the desired magnetic disks were obtained.

Each of the various types of the magnetic disks thus obtained was evaluated for the flying height of the magnetic head and head-hit properties. The surface characteristics of each disk from 20 to 45 mm in radius was evaluated. For the evaluation, each disk was rotated at a rate of from 500 to 2,000 rpm while providing a flying magnetic head equipped with a pressure sensor to count the frequency of head hits against the disk, and the average for 10 disks×2 faces was obtained. The flying height of the magnetic head was determined from the peripheral speed of the rotating magnetic disk; the relation between the peripheral speed of magnetic disk and the flying height of the magnetic head was obtained previously for use in the actual evaluation.

Figure 2:
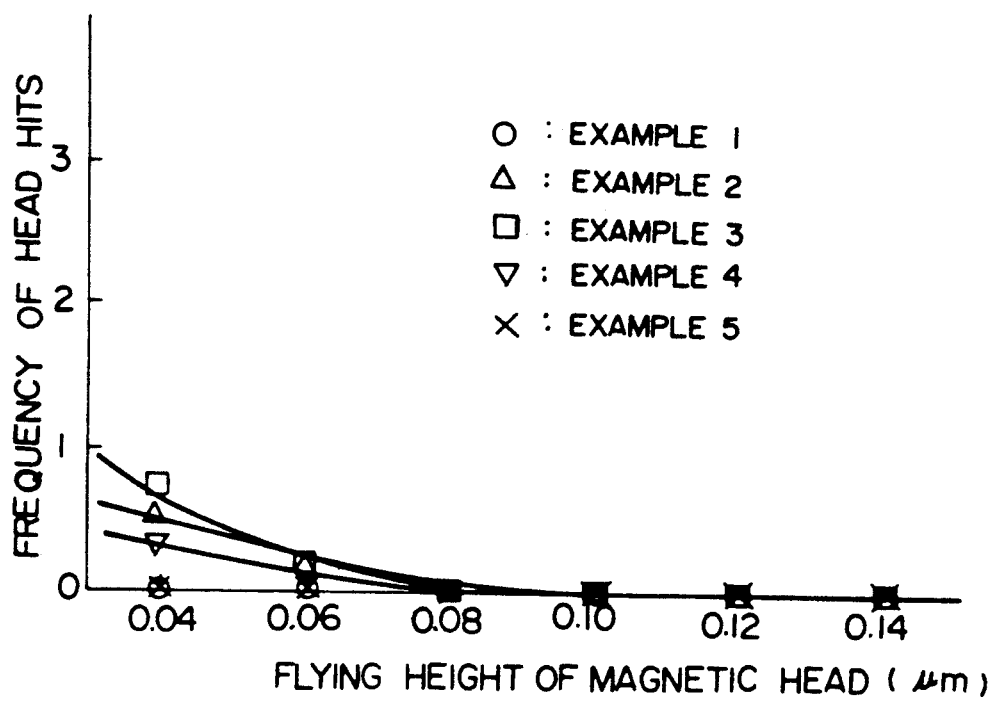
FIG. 2 is a graph which relates the frequency of head hits against a magnetic disk to the flying height of the magnetic head, for each of the magnetic disks obtained in Examples 1 to 5.
Figure 3:
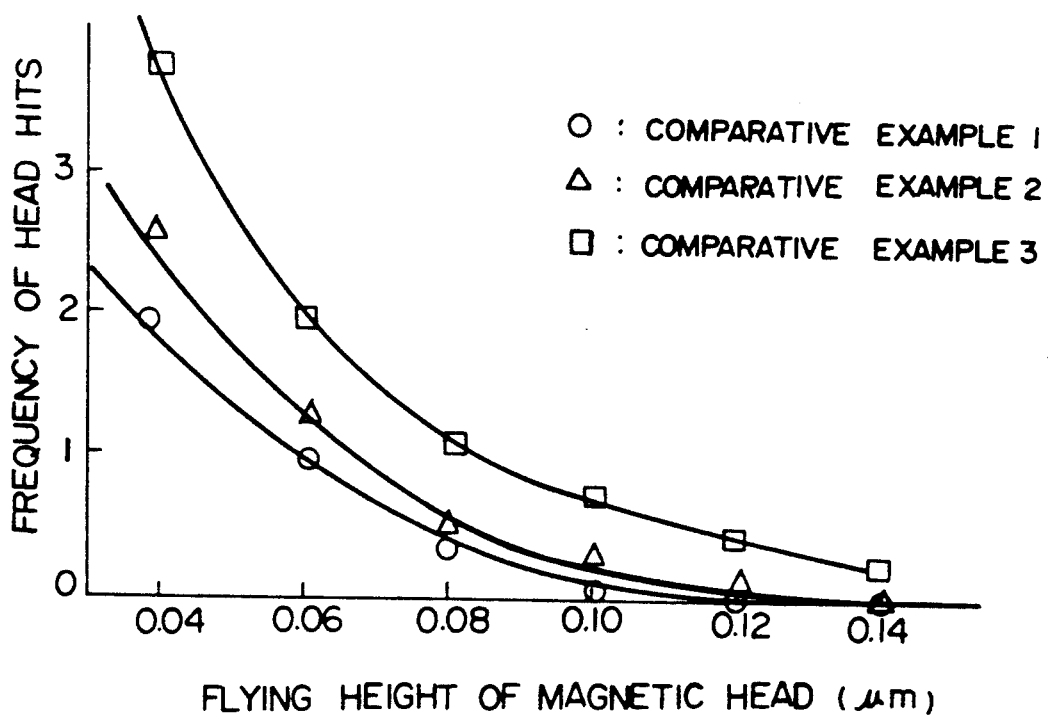
FIG. 3 is a graph which relates the frequency of head hits against a magnetic disk to the flying height of the magnetic head, for each of the magnetic disks obtained in Comparative Examples 1 to 3.
Figure 4:
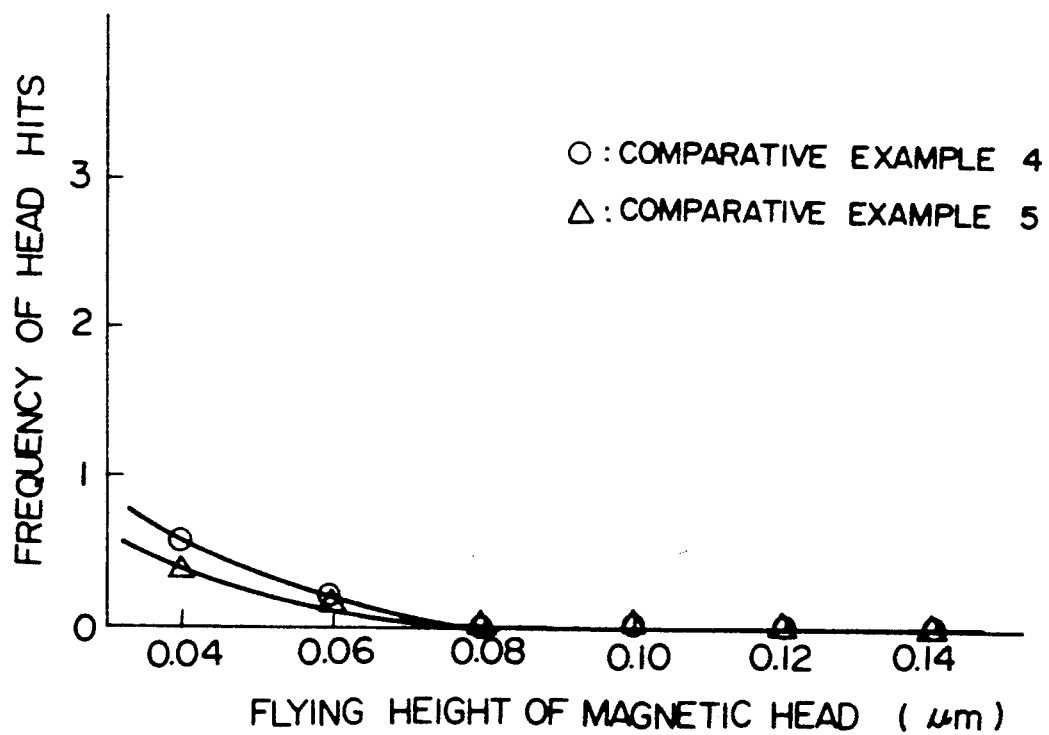
FIG. 4 is a graph which relates the frequency of head hits against a magnetic disk to the flying height of the magnetic head, for each of the magnetic disks obtained in Comparative Examples 4 and 5.

The frequencies of head hits against each of the magnetic disks obtained in Examples 1 to 5 and Comparative Examples 1 to 5 are shown in relation with the flying height of the magnetic head in FIGS. 2 to 4. The figures clearly read that the magnetic disks of examples 1 to 5 according to the present invention had no head hit with the magnetic head even at a low height of about 0.08 μm. It can be therefore assumed that the disks according to the present invention have no protrusions exceeding 0.08 μm in height on the surface thereof.

In contrast to the magnetic disks according to the present invention, those of the Comparative Examples 1 to 3 make head hit against the magnetic head already at a height of 0.10 μm. It is therefore assumable that the disks according to Comparative Examples 1 to 3 suffer from protrusions about 0.1 μm in height being produced on the surface thereof.

As shown in the foregoing, the substrates having subjected to texturing according to the present invention using a processing solution comprising dispersed diamond grains provide magnetic disks having protrusions of lower height. Accordingly, the flying magnetic head can be maintained at a low flying height from the magnetic disks. However, the presence of larger diamond grains from 4 to 5 μm in diameter considerably increases the number of protrusions on the surface of the textured substrate to frequently cause head-hit.

In the magnetic disks according to Comparative Examples 4 and 5 in which alumina abrasive grains were used for the texturing, head-hit occurred on the magnetic head at a flying height as 0.08 μm. However, sticking of magnetic head to the disk was observed to occur. In the magnetic disk of Examples 1 to 5 according to the present invention, in contrast to above, no head sticking occurred, and yet, no problem of head-hit was also encountered.

It can be seen from the foregoing, that the process for fabricating a magnetic disk according to the present invention advantageously provides magnetic disks which are capable of maintaining the magnetic heads at a low flying height without suffering problems such as sticking of magnetic heads and head-hit. Accordingly, the process according to the present invention enables fabrication of magnetic disks suited for high density recording.

While the invention has been described in detail and with reference to specific examples thereof, it will be apparent to one skilled in the art that various changes and modifications can be made therein without departing from the spirit and scope thereof.

What is claimed is:

1. A process for fabricating a magnetic disk which comprises texturing a magnetic disk substrate made of a non-magnetic material having provided on the surface thereof a hard layer of a metal or an oxide to thereby provide fine irregularities on the surface of said substrate, followed by establishing thereon a magnetic recording layer comprising a film of a ferromagnetic metal, wherein, said texturing is carried out using a processing solution comprising an aqueous solution of a surface active agent having dispersed therein diamond abrasive grains substantially only not larger than 4 μm in grain diameter.

2. The process for fabricating a magnetic disk as claimed in claim 1, wherein 90% by volume average or more of said diamond abrasive grains fall in the size range of from 1 to 3 μm in diameter.

3. The process for fabricating a magnetic disk as claimed in claim 1, wherein said processing solution contains 5% by weight or less of said surface active agent.

4. The process for fabricating a magnetic disk as claimed in claim 1, wherein said processing solution contains 5% by weight o less of dispersed diamond abrasive grains.

5. The process for fabricating a magnetic disk as claimed in claim 1, wherein said magnetic recording layer comprises a film produced by sputtering, vapor deposition, or plating.

6. The process for fabricating a magnetic disk as claimed in claim 5, wherein said film having deposited by sputtering comprises $\gamma$-$Fe_2O_3$, a Co based alloy, a Co-Ni system alloy, a Co-Pt system alloy, a Co-Cr-Ta system alloy, or an Fe based alloy.

7. The process for fabricating a magnetic disk as claimed in claim 1, wherein a Cr layer or an Cr alloy layer is provided as an under layer for said magnetic recording layer.

8. The process for fabricating a magnetic disk as claimed in claim 1, wherein said non-magnetic material for the disk substrate is a non-magnetic metal, a glass, or a resin.

* * * * *